United States Patent
Coleman et al.

(10) Patent No.: US 6,771,501 B2
(45) Date of Patent: Aug. 3, 2004

(54) FIRE RESISTANT ELECTRONIC ENGINE CONTROLLER

(75) Inventors: David Coleman, Stratford-upon-Avon (GB); Geoffrey Slack, Solihull (GB); Anthony Cheshire, Solihull (GB)

(73) Assignee: Lucas Industries Limited (GB)

( * ) Notice: Subject to any disclaimer, the term of this patent is extended or adjusted under 35 U.S.C. 154(b) by 0 days.

(21) Appl. No.: 10/247,001

(22) Filed: Sep. 19, 2002

(65) Prior Publication Data

US 2003/0056491 A1 Mar. 27, 2003

(30) Foreign Application Priority Data

Sep. 24, 2001 (GB) .............................................. 0122956

(51) Int. Cl.⁷ .............................................. H05K 7/20
(52) U.S. Cl. .................. 361/700; 165/80.3; 165/104.33; 165/185; 361/600; 361/679; 361/688; 361/690; 361/730; 60/239; 60/734
(58) Field of Search ............................... 60/39.281, 239, 60/734; 165/80.3, 104.33, 185; 174/52.1–52.3; 361/600, 679, 688–695, 700–715, 725–727, 728–744

(56) References Cited

U.S. PATENT DOCUMENTS

| | | | | | |
|---|---|---|---|---|---|
| 4,546,412 A | * | 10/1985 | Nakazawa et al. | .......... | 361/695 |
| 5,400,215 A | * | 3/1995 | Chung | .......... | 361/695 |
| 5,485,350 A | * | 1/1996 | Hecht et al. | .......... | 361/695 |
| 5,708,565 A | * | 1/1998 | Fairbanks | .......... | 361/704 |
| 5,842,514 A | * | 12/1998 | Zapach et al. | .......... | 165/104.33 |
| 6,341,063 B2 | * | 1/2002 | Kinoshita et al. | .......... | 361/699 |

FOREIGN PATENT DOCUMENTS

| | | |
|---|---|---|
| DE | 3338653 A | 5/1985 |
| EP | 0816177 A | 1/1998 |
| JP | 090074641 A | 3/1997 |

* cited by examiner

Primary Examiner—Gregory D. Thompson
(74) Attorney, Agent, or Firm—Baker & McKenzie

(57) ABSTRACT

An electronic engine controller is provided in which a backup controller or independent protection module is located in a sealed housing 8 which itself is located within the main housing 4 of the controller. The backup controller is thermally insulated such that it has enhanced durability in the event of a fire or the like occurring in the vicinity of the controller.

17 Claims, 6 Drawing Sheets

FIRE RESISTANT ELECTRONIC ENGINE CONTROLLER

The present invention relates to an electronic engine controller having improved fire resistance. Such a controller is suited for use in controlling the speed of a gas turbine engine within an avionics environment.

It is known to provide full authority digital engine controllers to control the speed and thrust of gas turbine engines used in an aircraft. These controllers are generally very reliable. However, they tend to be mounted in close proximity to the engine and as such are located in a potentially hazardous position since engine malfunction, for example a fire, might effect the engine controller.

Although an engine malfunction may have occurred, and there may be fire within the engine nacelle, the prevailing flight conditions may be such that immediate engine shutdown is not acceptable. This may, for example, be because the pilot is at a critical stage in a takeoff or landing manoeuvre. The electronic engine controller may also become overheated due to less serious fault conditions, for example due to leaks from hot air ducts.

According to a first aspect of the present invention, there is provided an engine controller comprising a primary controller for controlling an engine and an auxiliary controller for controlling the engine, in which the primary controller is located within a first housing and the auxiliary controller is located within a second housing which is supported within the first housing, and in which the auxiliary controller is thermally insulated from the first housing.

The auxiliary controller need not be required to provide or reproduce the full functionality of the primary controller. Thus a smaller unit having reduced functionality could be provided. In a preferred embodiment the auxiliary controller provides protection for the engine, such that limits are provided to certain parameters of engine performance, such as turbine speed. Under such circumstances the auxiliary controller functions as an independent protection module.

It is thus possible to provide an electronic engine controller in which part of the control functionality, namely the auxiliary controller or the independent protection module, is provided in a thermally protected environment such that it has enhanced resistance and durability to "over temperature" situations. Furthermore, by placing the housing for the auxiliary controller or the independent protection module within the housing of primary controller the auxiliary controller or the independent protection module can effectively benefit from two layers of protection against fire or mechanical damage.

Advantageously the second housing can be thinner and/or lighter then would be the case if the auxiliary controller or the independent protection module was located outside of the casing for the primary controller. Thus there is the potential for a weight saving to be obtained by virtue of placing the auxiliary controller or the independent protection module within the housing for the primary controller.

Preferably the auxiliary controller or the independent protection module and its associated housing sits within a recess formed in the first housing. The recess may be in the form of a closed channel. Thus the auxiliary controller or the independent protection module can be inserted into and/or removed from the housing of the primary controller without opening the first housing itself. Consequently the second housing is substantially, but not completely, enclosed by the primary controller and its associated first housing. However, the first housing provides a large and important degree of protection to the second housing in such an arrangement. In such an arrangement, the wall or face of the second housing which faces outwardly can be regarded as a front face of the auxiliary controller or the independent protection module and provides a route through which electrical connection can be made between the auxiliary controller or the independent protection module and the various aircraft systems with which it needs to interface. Advantageously the front face of the auxiliary controller or the independent protection module is itself protected by a fire wall and additionally insulation may be provided intermediate the fire wall and the front face. Alternatively the front face itself may be provided with a sufficient amount of insulation in order to ensure that heat leakage through that front face is sufficiently low to ensure that the internal temperature of the second housing remains within a predetermined value for a predetermined period of time. The predetermined value may be set at a guaranteed maximum working temperature of the electronics of the auxiliary controller or the independent protection module, and the predetermined period of time is chosen by the system designer, but may be in excess of several, for example 5, minutes.

Advantageously the second housing contains thermally insulating material in order to protect the auxiliary controller or the independent protection module in the event of fire. Additionally and/or alternatively, the first housing may contain insulating material in the vicinity of the second housing, for example on either an inner or outer surface of the wall defining the recess in which the second housing sits.

During operation, the electronics of the auxiliary controller or the independent protection module will dissipate heat. However the auxiliary controller or the independent protection module is itself located in a highly thermally insulated environment. It is therefore preferable that measures are taken to extract the heat generated within the second housing in order that the temperature therein remains within acceptable working levels. To this end, at least one heat dissipation device is provided to remove heat from the interior of the second housing. It will be appreciated that the interior of the second housing could be actively cooled, for example by pumping refrigerant/coolant into a heat exchange surface provided in the interior of the second housing. However, it is preferred that "passive" forms of cooling are provided.

A preferred form of cooling is provided by heat pipes. Heat pipes are well known devices which rely on the latent heat of vaporisation of a liquid contained within the pipe to transfer heat from a "hot end" of the pipe to a "cool end" of the pipe. In general, the liquid contained within the pipe evaporates at the hot end, and travels by virtue of vapour pressure to the cool end where it condenses. In order to continue operation of the heat pipe, the liquid then has to be returned to the hot end such that it can evaporate again. Advantageously, the transfer of liquid from the cool end to the hot end is performed solely by gravity. The avoidance of heat pipes having a wick contained therein (which constitutes the normal construction of a heat pipe) enables the heat transfer operation performed by the heat pipe to become effectively inhibited when the temperature at the notional "cool end" exceeds the temperature at the notional "hot end". Thus, in the present arrangement where the hot end is located inside of the second housing and the cool end is located outside of the second housing, then heat transfer along the heat pipe is significantly reduced once the temperature outside of the second housing exceeds the temperature inside of the second housing. The device functions like a thermal diode, only allowing substantial heat transfer in one direction.

Preferably the primary controller itself comprises first and second channels each of which is capable of fully controlling the functions of the associated gas turbine engine. Thus, in the event of failure of one channel, the other channel may take over.

Preferably the independent protection module acts, in the event of failure of the primary controller, to limit fuel flow to the engine when the aircraft is airborne or to shut off fuel when the aircraft is on the ground, possibly subject to other conditions such as speed being below a threshold, being satisfied. The independent protection module advantageously also comprises two channels with either channel being able to perform the control/protection tasks necessary to ensure operation of the engine.

Advantageously, each primary control channel has an independent power supply. Advantageously, each independent protection module or auxiliary channel has an independent power supply. Thus failure of any single power supply only effects one channel in either the primary controller, the auxiliary controller, or the independent protection module.

In order to enhance reliability, the independent protection module or auxiliary controller is effectively electrically isolated from the primary controller. That is to say that the independent protection module receives engine data, such as generator speed, engine spool speeds, turbine temperature and so on via data connections which are independent from those used to provide data to the primary controller. Indeed, each channel of the independent protection module and each channel of the primary controller advantageously receives this data via its own dedicated interfaces and connections. Similarly the primary controller and the independent protection module also need to receive certain airframe derived data in order to formulate a correct engine response. Such data includes pilot throttle position and optionally data regarding flight surface positions and undercarriage loading in order that the controllers or independent protection module can determine whether the aircraft is still on the ground or whether it is in a flight mode where the high lift surfaces are deployed, and consequently the aircraft can be expected to either be in the final stages of approach to the runway or in the early stages of takeoff from a runway.

Advantageously electrical connections to at least the independent protection module or the auxiliary controller are made using fire resistant male and female connectors, and connections between the pins of these connectors and the various cables connected to them are made by crimping (rather than soldering) such that the connections are heat resistant, and in particular that they cannot fail due to the melting of solder.

The independent protection module may monitor the engine performance at all times and be arranged to provide protection against the occurrence of engine overspeed or overthrust conditions. Thus the independent protection module controller may only need a limited subset of engine and other data.

According to a second aspect of the present invention, there is provided an independent protection module provided within an independent protection module casing for engagement within a co-operating recess of a structure arranged to hold the independent protection module, wherein one of the independent protection module's housing and the co-operating recess is thermally insulated, and cooling means are provided to remove heat from the interior of the independent protection module.

The present invention will further be described, by way of example, with reference to the accompanying drawings, in which:

FIGS. 1(A) and 1(B) are views of a full authority digital engine controller constituting an embodiment of the present invention;

FIG. 2 schematically illustrates the relationship between the primary controller and the independent protection module, which functions as a protection device;

Figure 1A:
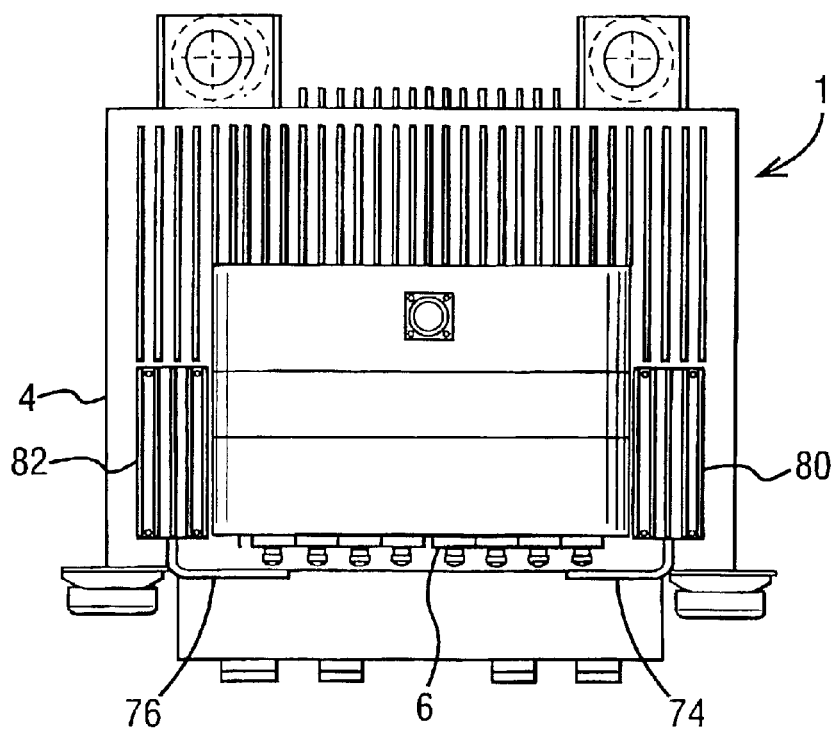
Figure 1B:
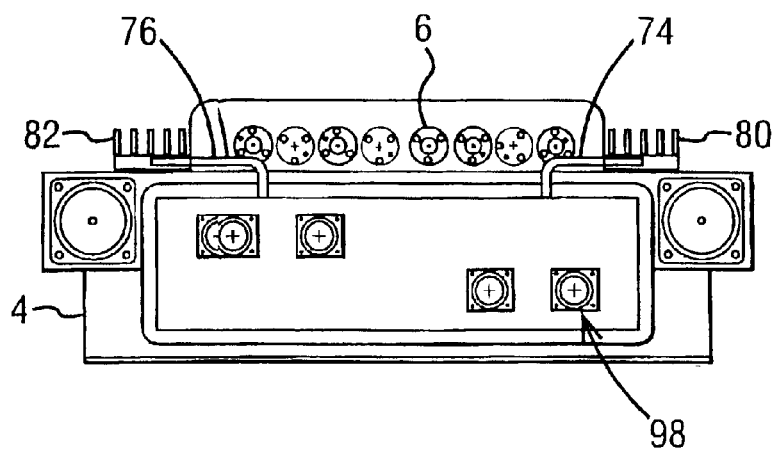

FIGS. 1(A) and 1(B) schematically illustrate a full authority digital engine controller module which is suitable for use in an aircraft. The controller 1 comprises a first case 4 which provides a sealed enclosure for the electronics of the primary engine controller 18. The thickness of the walls of the casing 4 are selected so as to provide the desired levels of rigidity, resistance to impact, and shock protection deemed appropriate by the designer. Electrical connections between the controller circuitry and the aircraft are made via connectors 6 of types well known to the person skilled in the art.

Figure 2:
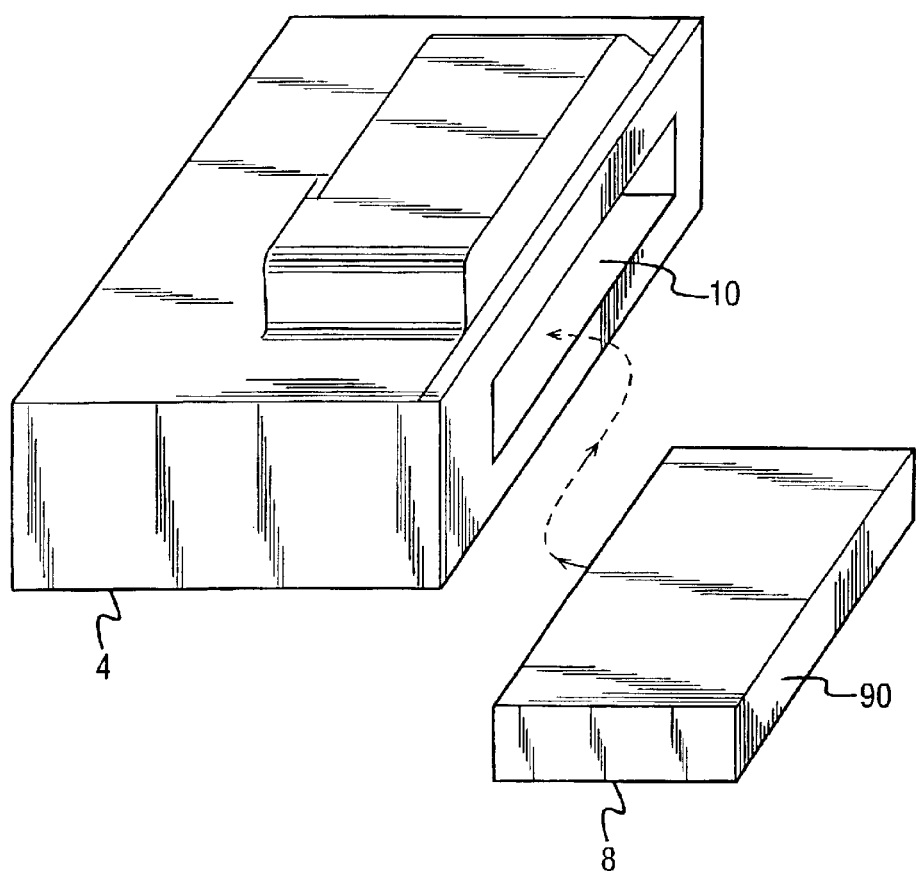

The case 4 has a closed recess 10 formed therein. That is to say, the recess forms a bay into which an auxiliary protection unit 38, i.e. an independent protection module, can be inserted, but the recess itself does not provide a path between the environment external to the casing 4 and the environment internal to the casing. As shown in FIG. 2, an independent protection module enclosed 38 within its own casing 8 is inserted into the recess 10 in the casing 4 in order that the casing 4 surrounds and protects the protection device and its casing 8.

Figure 3:
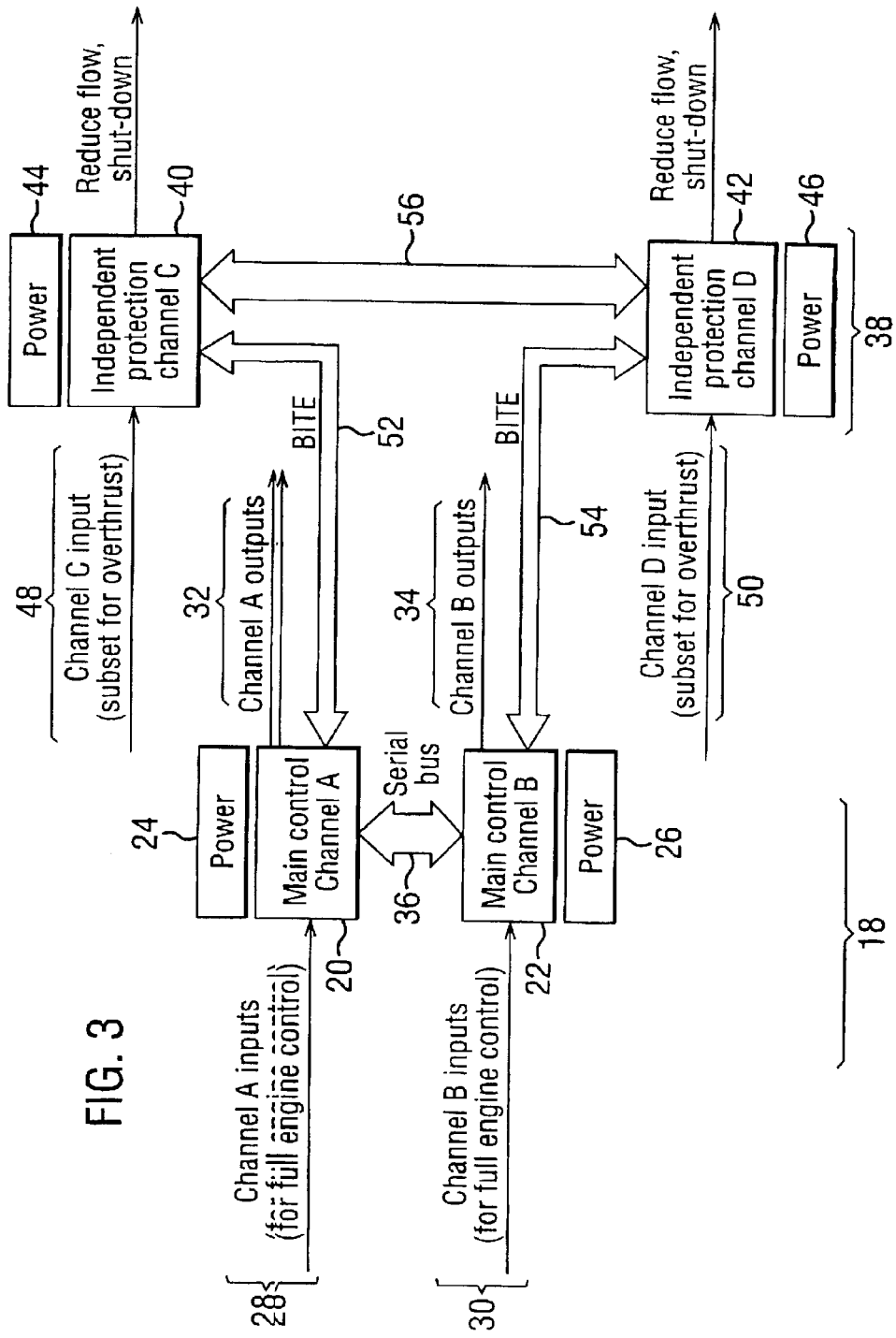
FIG. 3 is a cross section through the controller showing the position of the independent protection module and associated case within the first casing.

As shown in FIG. 3, the primary controller 18 comprises two main control channels 20 and 22. The first channel 20 has a power supply 24 associated uniquely with it. Similarly, the second channel 22 has a power supply 26 associated uniquely with it. Thus failure of the power supply of either channel does not cause the entire primary control system to fail. Each of the channels 20 and 22 also has its own set of inputs 28 and 30. The first channel 20 has a plurality of outputs 32 for controlling the various fuel control valves associated with the engine. Similarly, the second channel 22 has an equivalent set of outputs 34 for performing the same task. The channels 20 and 22 are interconnected by a serial bus 36 which enables them to exchange data in order that they can confirm that each other channel is working, and monitor the performance of each other's sensors and the like in a manner which is known to the person skilled in the art.

The independent protection module 38 comprises first and second independent protection channels 40 and 42. The first independent protection channel 40 is associated uniquely with power supply 44, whereas the second independent protection channel 42 has its own power supply 46. These power supplies are independent of the power supplies 24 and 26 associated with the first and second channels of the primary controller. Thus failure of any one of the power supplies does not affect more than one controller channel or one protection channel.

The first protection channel 40 receives a plurality of inputs 48 for monitoring the engine such that it has sufficient data to perform engine over-speed/over-thrust protection. Such protection may involve limiting the rate of supply of fuel, or shutting off fuel to an engine depending on whether the aircraft is flying or not. Similarly a second set of inputs 50 are provided to the second protection channel 42.

Although the electronics of the protection system are effectively isolated from the electronics of the primary controller, nevertheless it is advantageous to have a limited connection between the systems such that each can monitor, but not influence, the health of the other. Thus limited electrical connection between the first channel 20 of the primary controller and the first channel 40 of the protection module is provided via a built in test equipment (BITE) connection 52. Similarly a second BITE connection 54 extends between the second channel 22 of the primary controller and the second channel 42 of the protection module. The first and second channels 40 and 42 of the protection module also have a data exchange path 56 between the channels, for example, in the form of a serial bus, such that each may monitor the health of the other, and if necessary, can also swap data between the channels.

Figure 4:
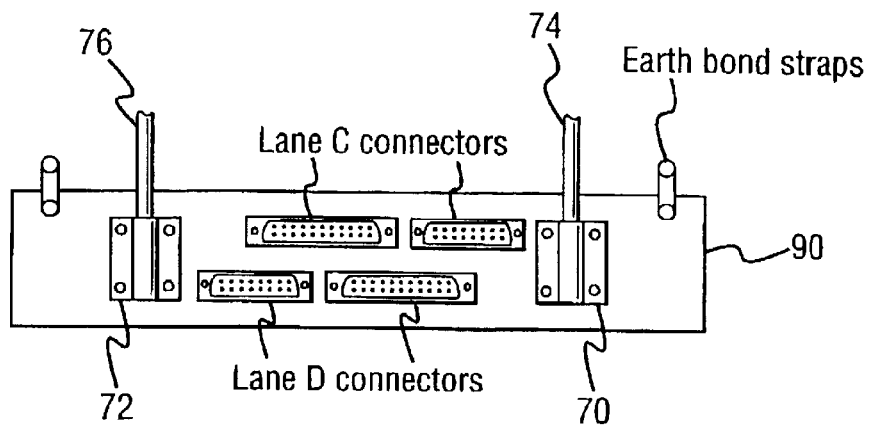
FIG. 4 is a view of the front panel of the auxiliary controller showing the connection to the heat pipes.

As noted hereinbefore, insulation can be applied to either the walls of the second housing 8, or to the walls defining the recess 10. Consequently the interior of the second housing 8 is thermally insulated from the environment and heat build up in there due to dissipation from the electronics of the protection module would have the potential to cause thermal failure of the device if steps were not taken to remove that heat. FIG. 4 shows the view of the front plate 90 of the casing 8 which shows that the front plate carries electrical connectors for the two controller lanes within the independent protection module (or, if appropriate, an auxiliary controller) herein labelled Lane C and Lane D, but also carries heat transfer brackets 70 and 72 which serve to form heat transfer paths from the electronics of the independent protection module to respective heat pipes 74 and 76 which, as shown in FIG. 1, terminate at finned heat sinks 80 and 82. The operation of heat pipes is well known by the person skilled in the art and need not be described herein any further, except to note that the heat pipes are chosen such that return of the condensed working fluid from the cold region in the vicinity of the heat sinks 80 and 82 to the hot region in the vicinity of the brackets 70 and 72 is by way of gravity. This ensures that, in the event of the exterior of the controller being exposed to high temperatures, the heat pipes do not conduct heat from the exterior of the casing to the auxiliary controller. In this way, the heat pipes can be thought of as functioning as thermal diodes.

Figure 5:
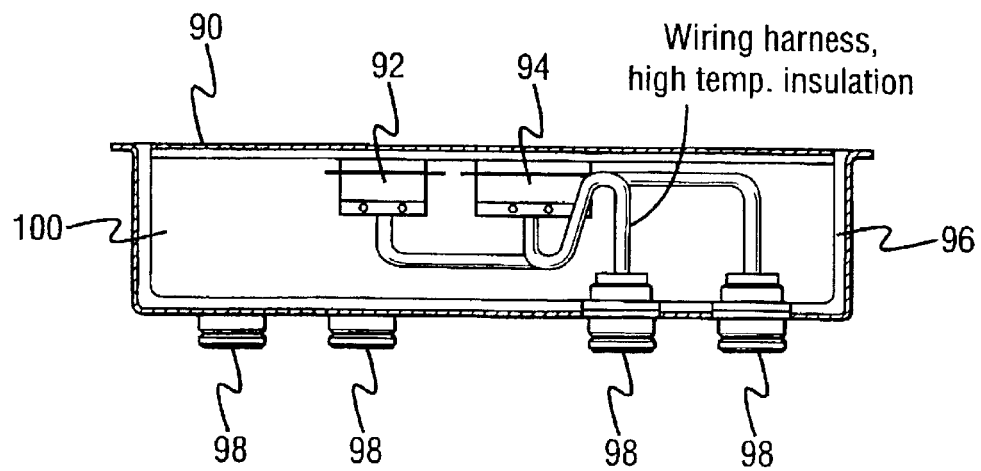
FIG. 5 is a plan view showing the interconnections between the front wall of the casing of the independent protection module and the fire wall thereof.

It is clear that the casing 4 forms an effective heat shield on five out of six faces of the independent protection module. However the front face, through which the electrical connections are made, has potential to be a point of thermal weakness. This is addressed by the provision of a fire shield, as shown in FIG. 5. The front face of the housing of the auxiliary controller is designated 90. Electrical connectors, for example D type connectors 92 and 94 extend forwardly of the front face 90. A removable fire wall 96 has further electrical connections 98 formed therein which, in use, provide the interfaces with the various aircraft electrical systems. Connections between the connectors 98 and the connectors 92 and 94 are made via a high temperature wiring harness with the terminations between the wires for the harness and the various connectors 92, 94 and 98 being made by crimping, rather than soldering, such that the joints do not fail under elevated temperatures.

In use, the fire wall 96 is secured to the housing 4 in order to provide protection to the front face 90. The view shown in FIG. 5 is a cross section through the fire wall and upper and lower end plates extending above and below the plane of FIG. 5 define the fire wall into a box shaped structure such that, when it is in position, the fire wall and the front plate 90 serve to define an enclosed fire protected cavity 100. Exit apertures are provided such that the heat pipes 74 and 76 can extend from the front surface 90 through the upper surface of the fire wall 96 and connect to the finned heat sinks 80 and 82, respectively.

Heat sensors are provided in the primary controller such that, in the event of excessive heat being detected a warning may be issued to the pilot. If the heat is excessive, the full authority digital engine controller (FADEC) may either request permission to, or automatically be granted authority to, shut down the engine. However, this authority is only automatic under conditions where loss of engine thrust is obviously tolerable. In conditions where this is not acceptable, for example because the high lift surfaces are deployed, authority to shut down the engine can be reserved by the pilot. Thus, the FADEC will attempt to control the engine, even in the event of an engine fire. If the fire progresses, the thermal stress on the primary controller may be such that one or both of its lanes fails. If a first lane fails, control is passed to the remaining operative lane. Failure of the FADEC due to over temperature conditions may result in unpredictable loss of control of the engine. Such loss of control could result in engine overthrust or overspeed which could be hazardous to the integrity of the engine or the airframe. The independent protection module, being thermally insulated, has a longer operational life in the event of a fire and can continue to control the engine and/or to provide protection against hazardous faults, for example, engine overspeed, for the design period, which is generally at least five minutes, or until such time as the pilot has taken such remedial action as is appropriate and is then in a position to shut down the failed engine.

Figure 6:
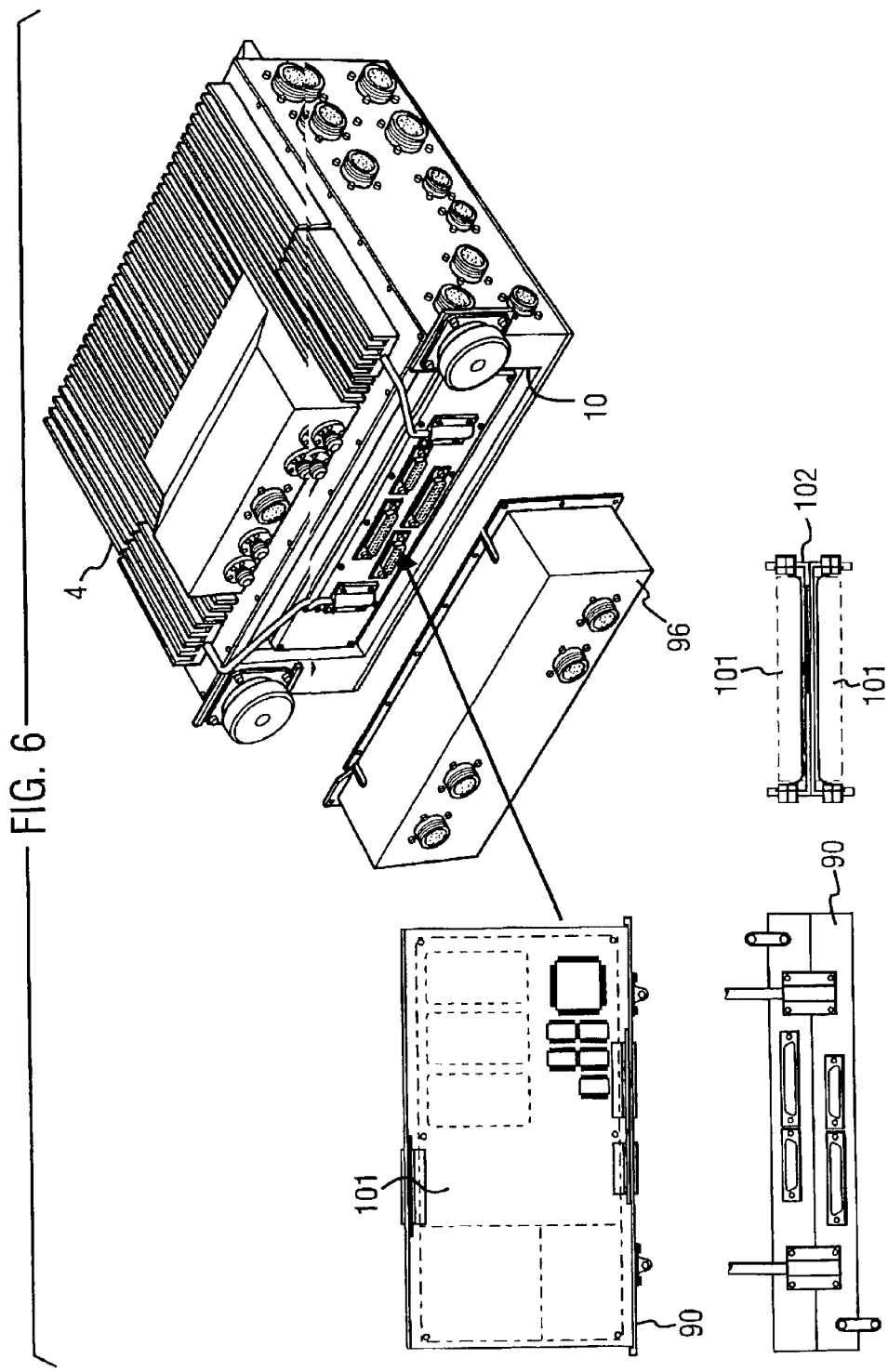
FIG. 6 is a perspective view of a controller constituting a further embodiment of the present invention.

FIG. 6 schematically illustrates a further embodiment of the invention. In the arrangement shown in FIG. 6, the first case 4 provides a sealed enclosure for the electronics of the primary engine and controller. The first case 4 also defines a closed recess 10 within the casing 4, the recess having a single opening to the exterior of the casing. The auxiliary controller or independent protection module is, as before, formed as a slot-in unit which sits within the recess 10. However, the independent protection module is not enclosed within its own case, but instead comprises of circuit boards 101 mounted on supporting racks 102 with the racks 102 supporting the front face 90. Thus, the sealed 'box' surrounding the independent protection module is only formed once the protection module is placed within the recess 10. Once this occurs, the front face 90 seals the entrance to the recess 10 such that the circuit boards 101 are now fully enclosed.

Figure 7:
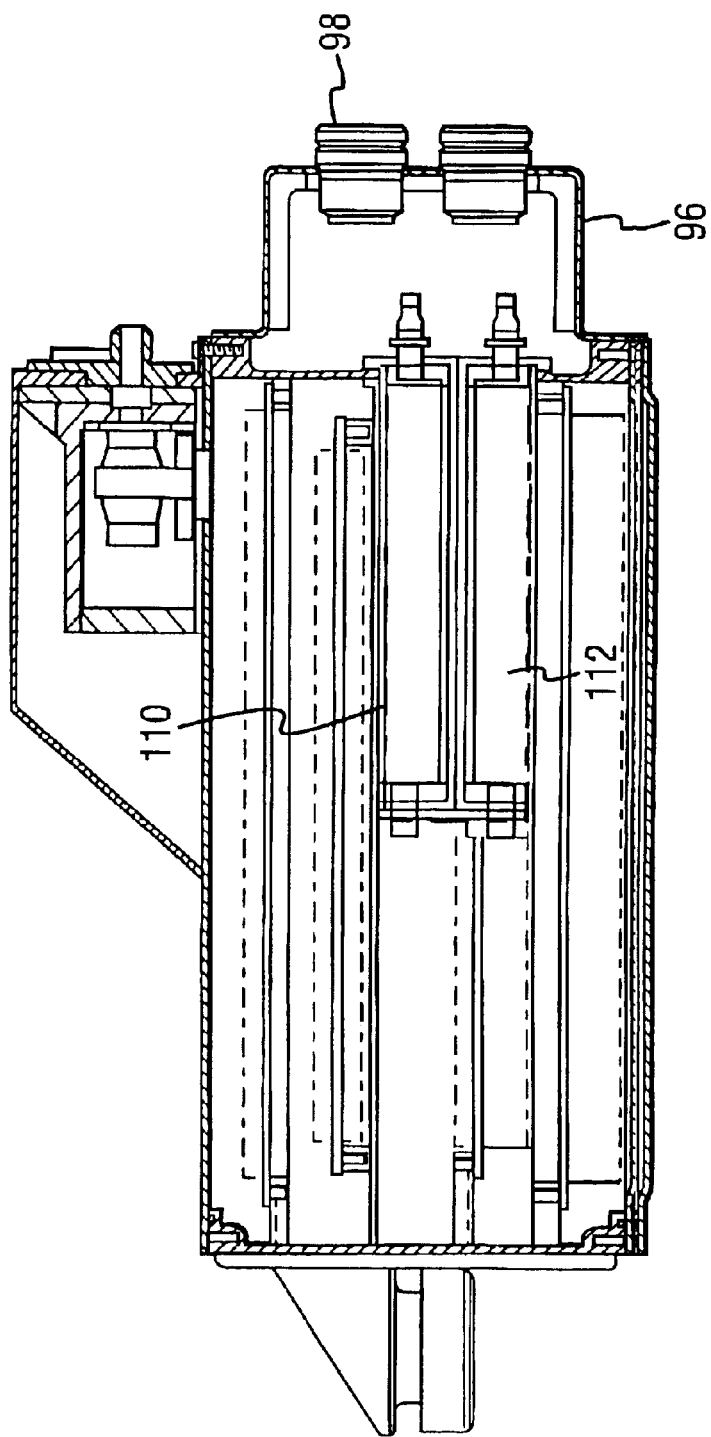
FIG. 7 is a cross-sectional view through the controller at FIG. 6.

FIG. 7 schematically illustrates a cross section through the full authority digital engine controller of FIG. 6, with the chain line 110 indicating the path of the internal walls of the first case 4 which act to define the recess 10 for the independent protection module 112.

In this way, it is still possible to provide an independent protection module which is housed in a enclosure as delineated by the walls 110 and the front face 90, the enclosure itself being fully enclosed within the casing of the full authority digitaling controller as defined by the housing 4 and the fire wall 96.

It is thus possible to provide an electronic engine controller in which, in the event of excessive heat, shut down of the engine is not necessarily automatically authorised and such that the controller can continue to control the engine with protection in place against potentially hazardous faults (such as overspeed or overthrust) even under such adverse conditions such that the pilot has the opportunity to take appropriate action to avoid loss of life.

What is claimed is:

1. An engine controller, characterised by comprising a primary controller for controlling an engine, said primary controller located within a first housing, and an auxiliary controller for controlling the engine, said auxiliary controller located within a second housing supported within the first housing, and in which the auxiliary controller is thermally insulated from the first housing, and in which at least one heat dissipation device is provided to remove heat from the interior of the second housing.

2. An engine controller as claimed in claim 1, in which the second housing sits within a recess in the first housing.

3. An engine controller as claimed in claim 2, in which the second housing is substantially enclosed by the first housing.

4. An engine controller as claimed in claim 1, in which a first wall of the second housing does not face towards the interior of the first housing, and forms support for electrical connectors of the auxiliary controller.

5. An engine controller as claimed in claim 4, in which the first wall is disposed behind a fire shield.

6. An engine controller as claimed in claim 1, in which the at least one heat dissipation device comprises a heat pipe.

7. An engine controller as claimed in claim 6, in which the heat pipe is configured to act as a thermal diode.

8. An engine controller as claimed in claim 6, in which the heat pipe of the or each heat dissipation device is connected to a heat sink located on an external surface of the first housing.

9. An engine controller as claimed in claim 6, in which the return of fluid from the cool end of the heat pipe to the hot end of the heat pipe is by gravity.

10. An engine controller as claimed in claim 1, in which the auxiliary is thermally insulated by thermal insulation within the second housing.

11. An engine controller as claimed in claim 1, in which the auxiliary controller is thermally insulated by thermal insulation provided in the first housing in the vicinity of the second housing.

12. An engine controller as claimed in claim 1, in which electrical connections to electrical connectors for supplying power to the auxiliary controller, and for supplying and removing signals from the auxiliary controller are made via crimped connections.

13. An engine controller as claimed in claim 1, in which the auxiliary controller has limited functionality.

14. An engine controller as claimed in claim 1, in which the auxiliary controller is a protection module to limit the fuel flow to the engine so as to avoid hazardous operation of the engine.

15. An engine controller as claimed in claim 14, in which the protection module provides protection against one or more of engine overspeed and engine overthrust.

16. An engine controller as claimed in claim 1, in which the second housing is, at least in part, defined by walls which define a recess in the first housing.

17. An engine controller as claimed in claim 1, in which electrical circuitry of the auxiliary controller is separated from the environment surrounding the engine controller by two layers of material forming the first and second housings respectively.

* * * * *